United States Patent
Kojima et al.

(10) Patent No.: US 8,697,572 B2
(45) Date of Patent: Apr. 15, 2014

(54) METHOD FOR FORMING CU FILM AND STORAGE MEDIUM

(75) Inventors: Yasuhiko Kojima, Nirasaki (JP); Kenji Hiwa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/211,870

(22) Filed: Aug. 17, 2011

(65) Prior Publication Data

US 2012/0028462 A1 Feb. 2, 2012

Related U.S. Application Data

(63) Continuation of application No. PCT/JP2010/051120, filed on Jan. 28, 2010.

(30) Foreign Application Priority Data

Feb. 17, 2009 (JP) ................................ 2009-034069

(51) Int. Cl.
*H01L 21/44* (2006.01)

(52) U.S. Cl.
USPC .................................. 438/653; 257/E21.584

(58) Field of Classification Search
USPC .................................. 438/653; 257/E21.584
See application file for complete search history.

(56) References Cited

U.S. PATENT DOCUMENTS

| | | | |
|---|---|---|---|
| 2004/0185683 A1* | 9/2004 | Nakamura | 438/957 |
| 2008/0020934 A1* | 1/2008 | Yoshii et al. | 505/100 |
| 2008/0042281 A1* | 2/2008 | Abe | 257/751 |

FOREIGN PATENT DOCUMENTS

| | | |
|---|---|---|
| CN | 101016638 A | 8/2007 |
| CN | 101164161 A | 4/2008 |
| JP | 10-229084 | 8/1998 |
| JP | 2000-282242 | 10/2000 |
| JP | 2006-269623 A | 10/2006 |
| KR | 10-2000-0062779 | 10/2000 |
| KR | 10-2007-0118151 A | 12/2007 |

OTHER PUBLICATIONS

Jung-Chao Chiou et al.; "Copper Chemical Vapor Deposition from Cu (hexafluoroacetylacetonate) trimethylvinylsilane"; Journal of Electronic Materials, 1994, vol. 23, No. 4, pp. 383-390.
Seung-Yun Lee et al.; "Effects of the Partial Pressure of Copper (I) Hexafluoroacetylacetonate Trimethylvinylsilane on the Chemical Vapor Deposition of Copper"; Jpn. J. Appl. Phys. Part 1, 1997, vol. 36, No. 8, pp. 5249-5252.
A. Yoshida et al.; "Copper film prepared with ArF excimer laser"; Applied Surface Science, 2001, vol. 169-170, pp. 493-495.

\* cited by examiner

*Primary Examiner* — Tony Tran
(74) *Attorney, Agent, or Firm* — Oblon, Spivak, McClelland, Maier & Neustadt, L.L.P.

(57) ABSTRACT

In a method for forming a Cu film, a CVD Cu film is formed on a CVD-Ru film that is formed on a wafer W. In the method, the wafer W having the CVD-Ru film is loaded into a chamber 1, and a film-forming source material in a vapor state is introduced into the chamber 1. The film-forming source material includes Cu(hfac)TMVS that is a Cu complex having a vapor pressure higher than that of $Cu(hfac)_2$ produced as a by-product during the film formation. When the CVD-Cu film is formed, the pressure within the chamber 1 is controlled to a pressure at which the desorption and diffusion of $Cu(hfac)_2$ adsorbed on the surface of the CVD Ru film proceed.

6 Claims, 7 Drawing Sheets

METHOD FOR FORMING CU FILM AND STORAGE MEDIUM

This application is a Continuation Application of PCT International Application No. PCT/JP2010/051120 filed on Jan. 28, 2010, which designated the United States.

FIELD OF THE INVENTION

The present invention relates to a method for forming a Cu film by chemical vapor deposition (CVD) on a substrate such as a semiconductor substrate or the like, and a storage medium.

BACKGROUND OF THE INVENTION

Recently, along with the trend toward high speed of semiconductor devices and miniaturization of wiring patterns, Cu having higher conductivity and electromigration resistance than Al attracts attention as a material for wiring, a Cu plating seed layer, and a contact plug.

As for a method for forming a Cu film, physical vapor deposition (PVD) such as sputtering has been widely used. However, it is disadvantageous in that a step coverage becomes poor due to miniaturization of semiconductor devices.

Therefore, as for a method for forming a Cu film, there is used CVD for forming a Cu film on a substrate by a thermal decomposition reaction of a source gas containing Cu or by a reduction reaction of the source gas by a reducing gas. A Cu film (CVD-Cu film) formed by CVD has a high step coverage and a good film formation property for a thin, long and deep pattern. Thus, the Cu film has high conformability to a fine pattern and is suitable for formation of wiring, a Cu plating seed layer and a contact plug.

In the case of using a method for forming a Cu film by CVD, there is suggested a technique for using as a film-forming material (precursor) a Cu complex such as copper hexafluoroacetylacetonate trimethylvinylsilane (Cu(hfac)T-MVS) or the like and thermally decomposing the Cu complex (see, e.g., Japanese Patent Application Publication No. 2000-282242).

Meanwhile, there is suggested a technique which uses, as a barrier metal or an adhesion layer of Cu, an Ru film (CVD-Ru film) formed by CVD (see Japanese Patent Application Publication No. H10-229084). The CVD-Ru film has a high step coverage and high adhesivity to a Cu film. Hence, it is suitable for the barrier metal or the adhesion layer of Cu.

However, when a monovalent diketone-based complex such as the aforementioned Cu(hfac)TMVS is used as the film-forming material of the CVD-Cu film, a by-product having a vapor pressure lower than that of the film-forming material is produced during the CVD-Cu film formation. The by-product is adsorbed on the surface of the formed film. Due to poisoning, the chemical deactivation occurs on the surface of the Ru film serving as the surface of the formed film.

Further, the adsorption of the Cu material is hindered, and the wettability between the Cu film and the Ru film is decreased. As a result, the initial nucleus density of Cu is decreased, and the surface texture of the Cu film deteriorates (rough surface patterning). Accordingly, the quality of the Cu film is decreased, and the adhesivity between the Cu film and the Ru film is decreased. These problems are generated even when a film other than the CVD-Ru film is used as a surface of a formed film.

SUMMARY OF THE INVENTION

In view of the above, the present invention provides a method for forming a Cu film, which is capable of providing a smooth and high-quality CVD-Cu film on a base with high adhesivity. The present invention also provides a storage medium storing a program for performing the film forming method.

The present inventors have examined the mechanism in which the adsorption of a Cu material is hindered and the wettability between a Cu film and a base film is decreased due to the adsorption of a by-product in the case of using a film-forming material having a vapor pressure higher than that of a by-product. As a result, they have found that the by-product having a vapor pressure lower than that of the film-forming material is easily adsorbed on the substrate and this hinders the adsorption of the Cu material and decreases the wettability between the Cu film and the Ru film.

As a result of further examination, they have found that the adsorption and desorption of the by-product are affected by the pressure in the processing chamber. The adsorption becomes easier as the pressure is increased, whereas the desorption becomes easier as the pressure is decreased. Therefore, it was found that the adsorption hindrance of the Cu material and the decrease of the wettability between the Cu film and the Ru film due to the adsorption of the by-product on the substrate can be suppressed by decreasing the pressure in the processing chamber to a level at which the desorption and diffusion of the by-product adsorbed on the substrate proceed. The present invention has been conceived from the above conclusion.

In accordance with a first aspect of the present invention, there is provided a method for forming a Cu film, including: loading a substrate in a processing chamber; introducing a film-forming source material in a vapor state into the processing chamber, the film-forming source material including a Cu complex having a vapor pressure higher than that of a by-product produced during film formation; controlling a pressure in the processing chamber to a level at which desorption and diffusion of the by-product adsorbed on the substrate proceed; and forming a Cu film by decomposing the film-forming source material in the vapor state and depositing Cu on the substrate by CVD.

In accordance with a second aspect of the present invention, there is provided a computer readable storage medium storing a program for controlling a film forming apparatus. When executed, the program controls the film forming apparatus to perform a method for forming a Cu film which includes: loading a substrate in a processing chamber; introducing a film-forming source material in a vapor state into the processing chamber, the film-forming source material including a Cu complex having a vapor pressure higher than that of a by-product produced during film formation; controlling a pressure in the processing chamber to a level at which desorption and diffusion of the by-product adsorbed on the substrate proceed; and forming a Cu film by decomposing the film-forming source material in the vapor state and depositing Cu on the substrate by CVD.

DETAILED DESCRIPTION OF THE EMBODIMENTS

Hereinafter, embodiments of the present invention will be described with reference to the accompanying drawings which form a part hereof.

<Configuration of a Film Forming Apparatus for Performing Film Forming Method of the Present Invention>

Figure 1:
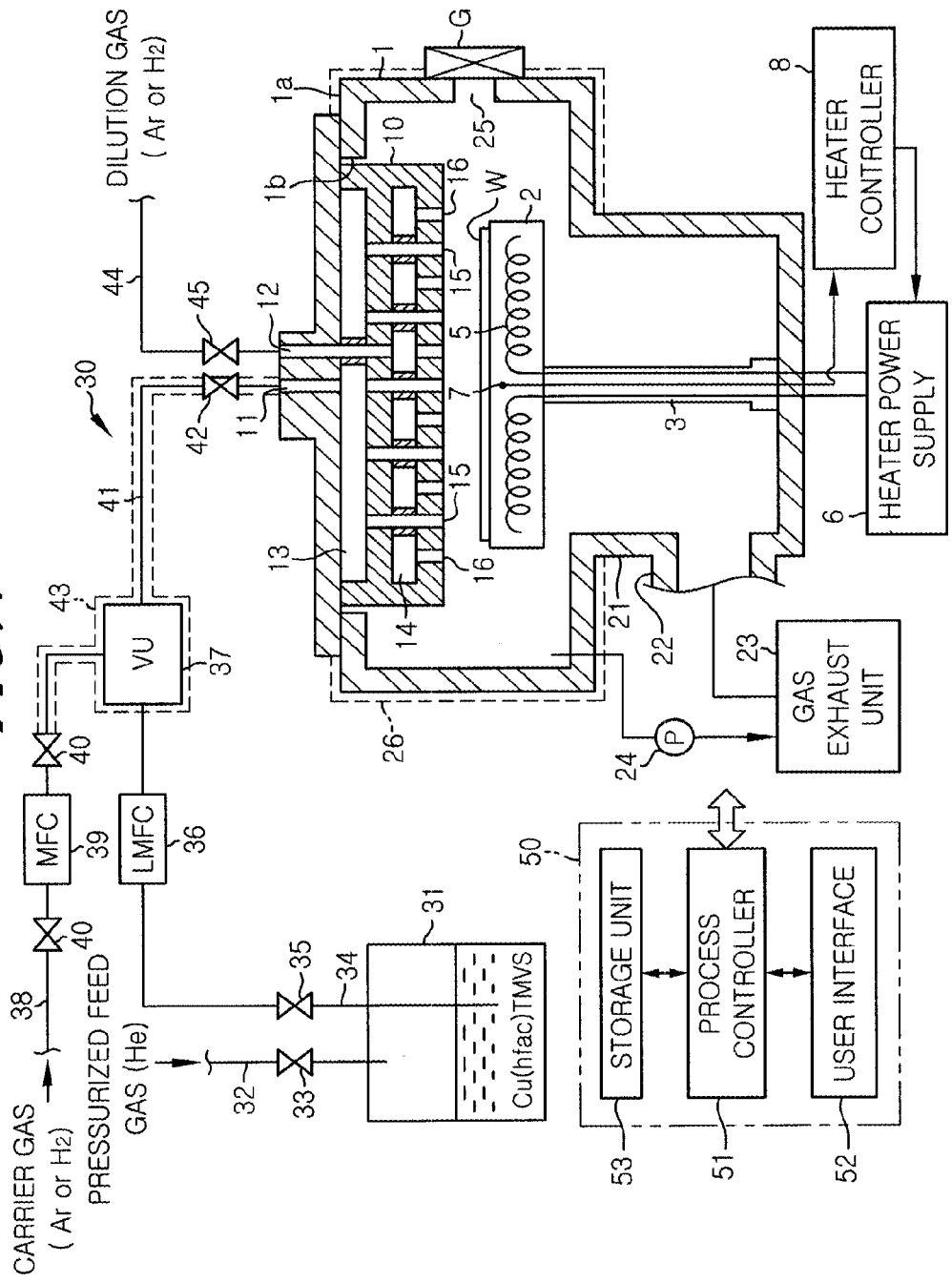
FIG. 1 shows a substantial cross section of an exemplary configuration of a film forming apparatus for performing a method for forming a Cu film in accordance with an embodiment of the present invention.

FIG. 1 is a substantial cross sectional view showing an exemplary configuration of a film forming apparatus for performing a method for forming a Cu film in accordance with an embodiment of the present invention.

The film forming apparatus 100 includes a substantially cylindrical airtight chamber 1, and a susceptor 2 provided in the chamber 1. The susceptor 2 for horizontally supporting a semiconductor wafer W as a substrate to be processed is supported by a cylindrical supporting member 3 provided at the center of the bottom portion of the chamber 1. The susceptor 2 is made of ceramic such as AlN or the like.

Further, a heater 5 is buried in the susceptor 2, and a heater power supply 6 is connected to the heater 5. Meanwhile, a thermocouple 7 is provided near the top surface of the susceptor 2, and a signal from the thermocouple 7 is transmitted to a heater controller 8. The heater controller is configured to transmit an instruction to the heater power supply 6 in accordance with the signal from the thermocouple 7 and control the wafer W to a predetermined temperature by controlling the heating of the heater 5.

A circular opening 1b is formed at a ceiling wall 1a of the chamber 1, and a shower head 10 is fitted in the circular opening 1b to protrude into the chamber 1. The shower head 10 discharges a film forming gas supplied from a gas supply mechanism 30 to be described later into the chamber 1. The shower head 10 has, at an upper portion thereof, a first inlet line 11 for introducing a Cu complex having a vapor pressure higher than that of a by-product produced by thermal decomposition of the film forming gas, e.g., copper hexafluoroacetylacetonate trimethylvinylsilane (Cu(hfac)TMVS) as a monovalent β-diketone complex, and a second inlet line 12 for introducing a dilution gas into the chamber 1. As for the dilution gas, Ar gas or $H_2$ gas is used, for example.

The inner space of the shower head 10 is separated into an upper space 13 and a lower space 14. The first inlet line 11 is connected to the upper space 13, and a first gas injection path 15 extends from the upper space 13, to the bottom surface of the shower head 10. The second inlet line 12 is connected to the lower space 14, and a second gas injection path 16 extends from the lower space 14 to the bottom surface of the shower head 10. In other words, the shower head 10 is configured to separately inject a Cu complex gas as a film-forming material and a dilution gas through the injection paths 15 and 16, respectively.

A gas exhaust chamber 21 is provided at a bottom wall of the chamber 1 to protrude downward. A gas exhaust line 22 is connected to a side wall of a gas exhaust chamber 21, and a gas exhaust unit 23 including a vacuum pump, a pressure control valve or the like is connected to the gas exhaust line 22. By driving the gas exhaust unit 23, the interior of the chamber 1 can be set to a predetermined depressurized state. Further, a pressure in the chamber 1 is detected by a pressure gauge 24. The pressure in the chamber 1 is controlled by adjusting an opening degree of the pressure control valve of the gas exhaust unit 23 based on the detected value. In the present embodiment, the pressure in the chamber 1 is controlled to a level at which the desorption and diffusion of the by-product adsorbed on the surface of the target wafer W proceeds.

Formed on the sidewall of the chamber 1 are a loading/unloading port 25 for loading and unloading the wafer W with respect to a wafer transfer chamber (not shown) and a gate valve G for opening and closing the loading/unloading port 25. Moreover, a heater 26 is provided on a wall of the chamber 1, and can control the temperature of the inner wall of the chamber 1 during the film formation.

The gas supply mechanism 30 has a film-forming source material tank 31 for storing, as a film-forming source material, a Cu complex, e.g., Cu(hfac)TMVS as a monovalent β-diketone complex in a liquid state, which has a vapor pressure higher than that of a by-product produced by thermal decomposition. The Cu complex of the film-forming source material may be another monovalent β-diketone complex such as Cu(hfac)MHY, Cu(hfac)ATMS, Cu(hfac)DMDVS, Cu(hfac)TMOVS, Cu(hfac)COD or the like. In the case of using a monovalent Cu complex in a solid state at a room temperature, it can be stored in the film-forming source material tank 31 while being dissolved in a solvent.

A pressurized feed gas line 32 for supplying a pressurized feed gas such as He gas or the like is inserted from above into the film forming source material tank 31, and a valve 33 is installed in the pressurized feed gas line 32. Further, a source material discharge line 34 is inserted from above into the film forming source material tank 31, and a vaporizer (VU) 37 is connected to the other end of the source material discharge line 34. A valve 35 and a liquid mass flow controller 36 are installed in the source material discharge line 34.

By introducing a pressurized feed gas into the film-forming source material tank 31 via the pressurized feed gas line 32, a Cu complex, e.g., Cu(hfac)TMVS, in the film-forming source material tank 31 is supplied in a liquid state to the vaporizer 37. At this time, the liquid supply amount is controlled by the liquid mass flow controller 36. A carrier gas line 38 for supplying Ar or $H_2$ gas as a carrier gas is connected to the vaporizer 37. A mass flow controller 39 and two valves 40 positioned at both sides of the mass flow controller 39 are provided in the carrier gas line 38.

Moreover, a film forming-material gas supply line 41 for supplying a Cu complex in a vapor state toward the shower head 10 is connected to the vaporizer 37. A valve 42 is installed in the film-forming source material gas supply line 41, and the other end of the film-forming source material gas supply line 41 is connected to the first inlet line 11 of the shower head 10. Furthermore, the Cu complex vaporized by the vaporizer 37 is discharged to the film- forming source material gas supply line 41 while being carried by the carrier gas, and then is supplied into the shower head 10 from the first inlet line 11.

A heater 43 for preventing condensation of the film-forming source material gas is provided at a region including the vaporizer 37, the film-forming source material gas supply line 41, and the valve 40 disposed at the downstream side of the carrier gas line. The heater 43 is powered by a heater power supply (not shown), and the temperature of the heater 43 is controlled by a controller (not shown).

A dilution gas supply line 44 for supplying a dilution gas is connected to the second inlet line 12 of the shower head 10. A valve 45 is installed in the dilution gas line 44. Further, Ar gas or $H_2$ gas is supplied as a dilution gas from the second inlet line 12 into the shower head 10 through the dilution gas supply line 44.

The film forming apparatus 100 includes a control unit 50 which is configured to control the respective components, e.g., the heater power supply 6, the gas exhaust unit 23 (pressure control valve, vacuum pump), the mass flow controllers 36 and 39, the valves 33, 35, 40, 42 and 45 and the like, and control the temperature of the susceptor 2 by using the heater controller 8. The control unit 50 includes a process controller 51 having a micro processor (computer), a user interface 52 and a storage unit 53. The respective components of the film forming apparatus 100 are electrically connected to and controlled by the process controller 51.

The user interface 52 is connected to the process controller 51, and includes a keyboard through which an operator performs a command input to manage the respective units of the film forming apparatus 100, a display for visually displaying the operational states of the respective components of the film forming apparatus 100, and the like.

The storage unit 53 is also connected to the process controller 51, and stores therein control programs to be used in realizing various processes performed by the film forming apparatus 100 under the control of the process controller 51, control programs, i.e., processing recipes, to be used in operating the respective components of the film forming apparatus 100 to carry out a predetermined process under processing conditions, various database and the like.

The processing recipes are stored in a storage medium provided in the storage unit 53. The storage medium may be a fixed medium such as a hard disk or the like, or a portable device such as a CD-ROM, a DVD, a flash memory or the like. Alternatively, the recipes may be suitably transmitted from other devices via, e.g., a dedicated transmission line.

If necessary, a predetermined processing recipe is read out from the storage unit 53 by the instruction via the user interface 52 and is executed by the process controller 51. Accordingly, a desired process is performed in the film forming apparatus 100 under the control of the process controller 51.

<Method for Forming Cu Film in Accordance with the Embodiment of the Present Invention>

Hereinafter, a method for forming a Cu film in accordance with the present embodiment by using the film forming apparatus configured as described above will be described.

Here, a case in which Cu(hfac)TMVS is used as a film-forming source material having a vapor pressure higher than that of a by-product produced during film formation will be described as an example.

Figure 2:
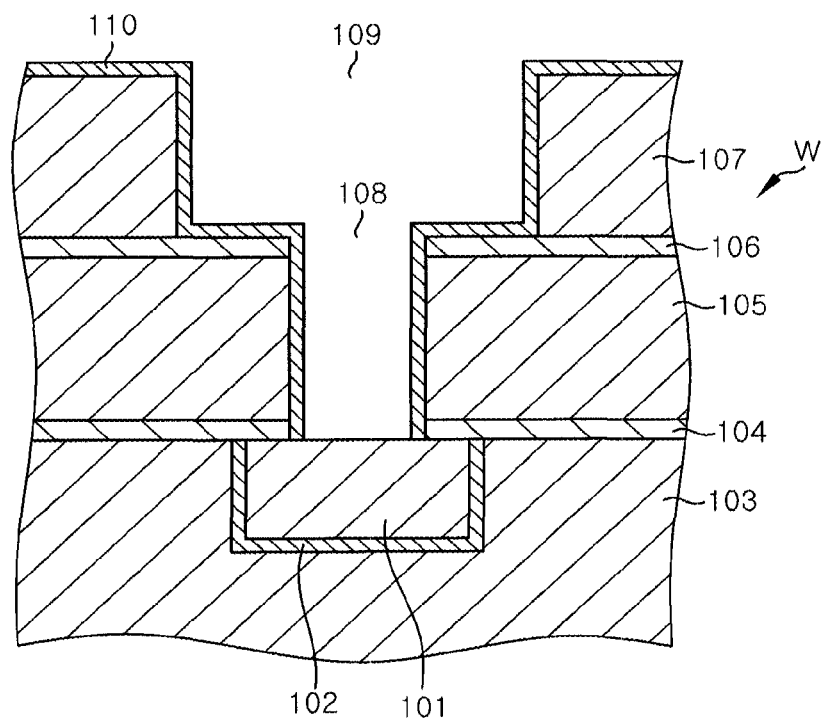
FIG. 2 is a cross sectional view showing an exemplary structure of a semiconductor wafer as a substrate to which the method for forming a Cu film in accordance with the embodiment of the present invention is applied.

Further, a Cu film (CVD-Cu film) is formed by CVD on an Ru film (CVD-Ru film) formed by CVD. For example, as shown in FIG. 2, a CVD-Cu film is formed on a wafer W obtained by forming a lower Cu wiring layer 101 on a lower wiring insulating layer 103 with a CVD-Ru film 102 interposed therebetween, forming a cap insulating film 104, an interlayer insulating layer 105 and a hard mask layer 106 thereon in that order, forming an upper wiring insulating layer 107 thereon, forming a via hole 108 that penetrates through the hard mask layer 106, the interlayer insulating film 105 and the cap insulating film 104 to reach the lower Cu wiring layer 101, forming a trench 109 as a wiring groove in the upper wiring insulating layer 107, and forming a CVD-Ru film 110 as a barrier layer (diffusion prevention layer) on the inner wall of the via hole 108 and the trench 109, and the top surface of the upper wiring insulating layer 107.

Preferably, the CVD-Ru film is formed by using $Ru_3(CO)_{12}$ as a film-forming source material. Accordingly, a CVD-Ru film of high purity can be obtained, and a pure and robust interface of Cu and Ru can be formed. The CVD-Ru film can be formed by using an apparatus having the same configuration as that shown in FIG. 1 except that vapor generated by heating $Ru_3(CO)_{12}$ in a solid state at a room temperature is supplied.

In forming a Cu film, the gate valve G opens, and the wafer W having the above structure is loaded into the chamber 1 by a transfer device (not shown) and then mounted on the susceptor 2. Next, the interior of the chamber 1 is exhausted by the gas exhaust unit 23, and a pressure in the chamber 1 is set to about 1.33 to 266.6 Pa (10 mTorr to 2 Torr). The susceptor 2 is heated to about 150 to 200° C. by the heater 5, and a carrier gas is supplied at a flow rate of about 100 to 1500 mL/min(sccm) via the carrier gas line 38, the vaporizer 37, the film-forming source material gas supply line 41, and the shower head 10. Moreover, a dilution gas is supplied at a flow rate of about 0 to 1500 mL/min(sccm) into the chamber 1 via the dilution gas supply line 44 and the shower head 10. In this way, the stabilization is obtained.

When the interior of the chamber 1 becomes stabilized under the predetermined conditions, the carrier gas and the dilution gas are supplied. In that state, Cu(hfac)TMVS in a liquid state is vaporized at about 50 to 70° C. by the vaporizer 37 and then is introduced into the chamber 10. Then, the Cu film formation is started. At this time, the flow rate of the liquid is about 100 to 500 mg/min.

Cu(hfac)TMVS as a film-forming source material is decomposed on the target wafer W heated by the heater 5 of the susceptor 2 by the reaction described in the following Eq. (1). As a result, Cu is deposited on the Ru film, and a Cu film is formed.

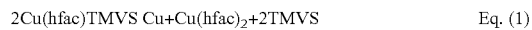

2Cu(hfac)TMVS Cu+Cu(hfac)$_2$+2TMVS     Eq. (1)

Figure 3:
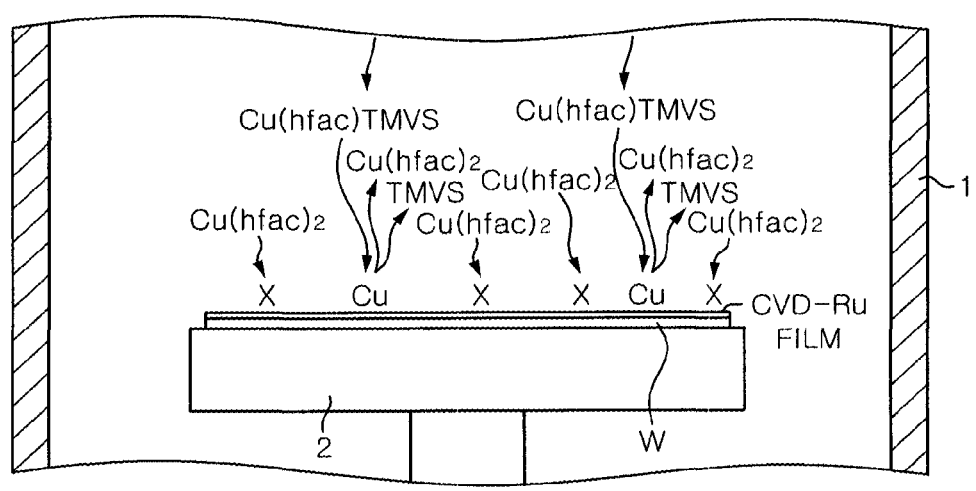
FIG. 3 is a schematic view for explaining a state in which the adsorption is hindered due to a by-product.

Meanwhile, a part of Cu(hfac)TMVS as the film-forming source material is decomposed even in a vapor state and produces Cu(hfac)$_2$. Cu(hfac)$_2$ has a vapor pressure lower than that of Cu(hfac)TMVS, and thus is easily adsorbed. As shown in FIG. 3, a larger amount of Cu(hfac)$_2$ as a by-product is adsorbed on the surface of the CVD-Ru film 110 compared to Cu(hfac)TMVS as a film-forming source material.

When Cu(hfac)$_2$ is adsorbed on the surface of the CVD-Ru film 110, the chemical deactivation occurs on the surface of the Ru film due to poisoning. Besides, the adsorption of Cu(hfac)TMVS is hindered, and the wettability between the Cu film and the Ru film is decreased. As a result, the initial nucleus density of Cu is decreased, and the surface texture of the Cu film becomes poor (rough surface patterning). In addition, the quality of the Cu film is decreased, and the adhesivity between the Cu film and the Ru film is decreased.

In the present embodiment, the drawbacks caused by the adsorption of Cu(hfac)$_2$ as a by-product are solved by controlling the pressure in the chamber 1. As mentioned early, the adsorption and desorption of the by-product are affected by the pressure in the chamber 1. As the pressure is increased, the by-product is easily adsorbed. As the pressure is decreased, a diffusion coefficient is increased and, thus, the by-product is easily desorbed. Hence, the pressure in the chamber 1 is decreased to a level at which the desorption and diffusion of Cu(hfac)$_2$ on the CVD-Ru film serving as a base film proceed. As in the present embodiment, when Cu(hfac)$_2$ is a by-product and a CVD-Ru film is a base film, the desorption and diffusion of Cu(hfac)$_2$ sufficiently proceed at a pressure of about 20 Pa (0.15 Torr) or less.

Figure 4:
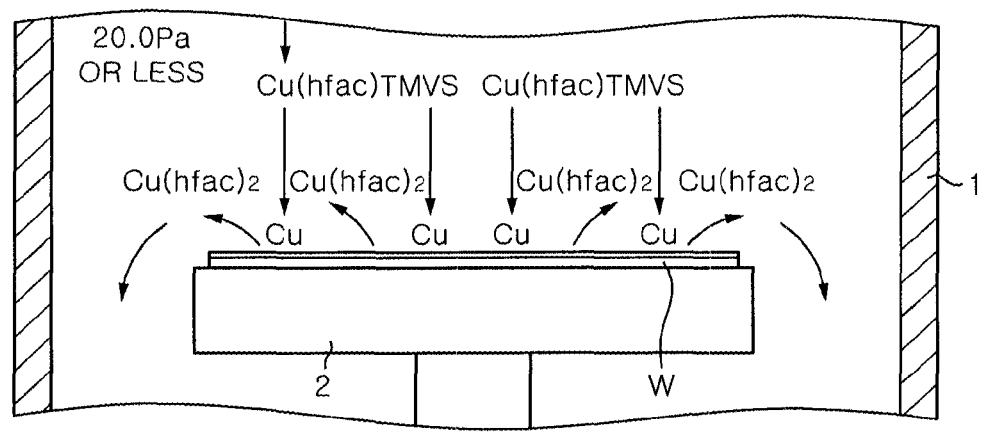
FIG. 4 is a schematic view for explaining a state of an interior of a chamber in the case of performing the method for forming a Cu film in accordance with the embodiment of the present invention.

Accordingly, as shown in FIG. 4, Cu(hfac)$_2$ adsorbed on the CVD-Ru film 110 is rapidly desorbed from the CVD-Ru 110 and exhausted. For that reason, the adsorption hindrance of Cu(hfac)TMVS and the decrease in the wettability between the Cu film and the Ru film due to the adsorption of Cu(hfac)$_2$ onto the CVD-Ru film 110 are suppressed. As a result, a smooth high-quality CVD-Cu film can be formed on the CVD-Ru film 110 with high adhesivity. If the pressure exceeds about 20 Pa (0.15 Torr) serving as a critical pressure, the adsorption of Cu(hfac)TMVS is hindered by Cu(hfac)$_2$, and the initial nucleus density of Cu is decreased.

Figure 5:
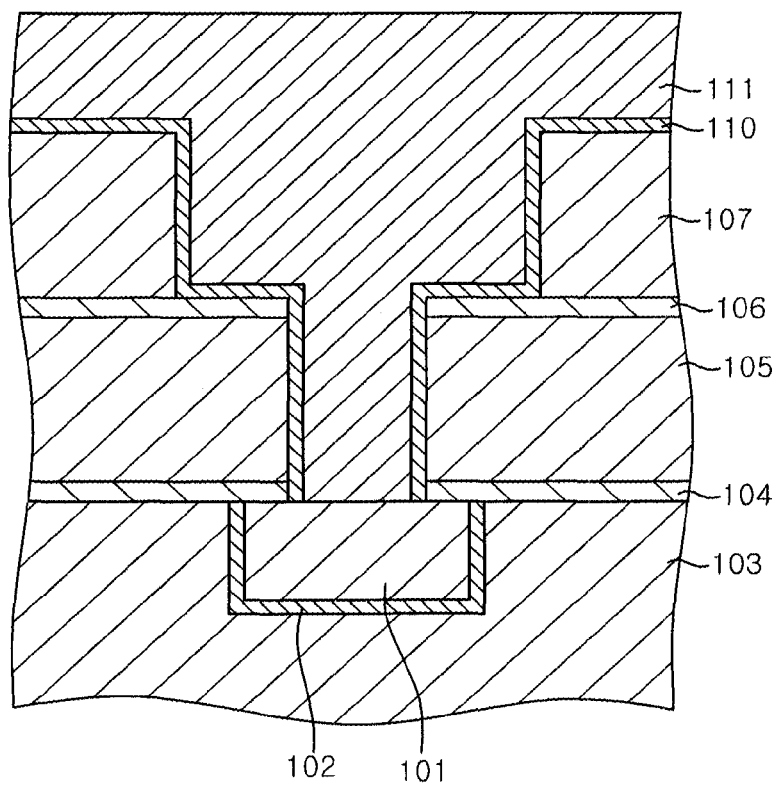
FIG. 5 is a cross sectional view showing a state in which a CVD-Cu film is formed as a wiring material on the semiconductor wafer having the structure shown in FIG. 2.
Figure 6:
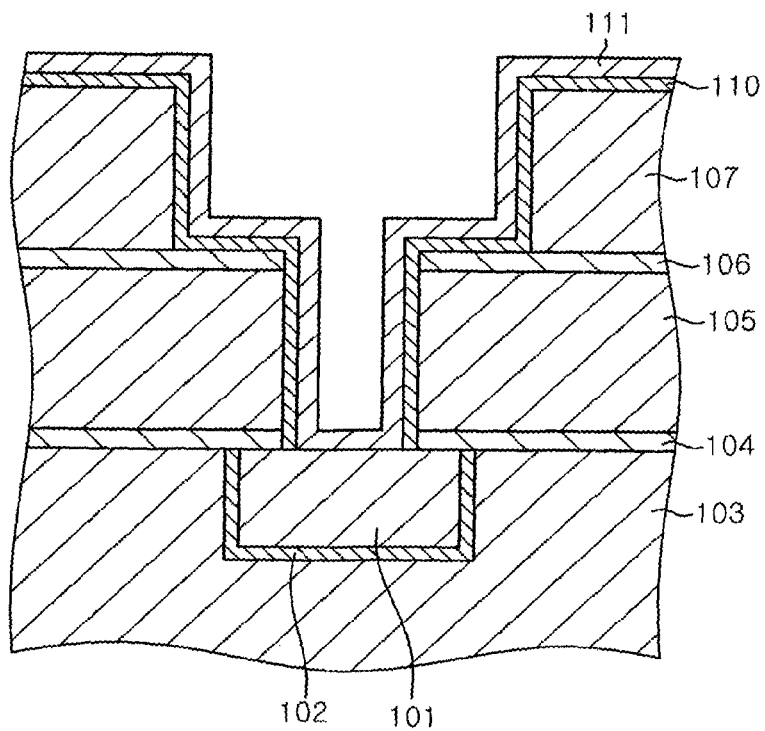
FIG. 6 is a cross sectional view showing a state in which a CVD-Cu film is formed as a Cu plating seed layer on the semiconductor wafer having the structure shown in FIG. 2.

The CVD-Cu film thus formed can be used as a wiring material or a Cu plating seed layer. When the CVD-Cu film is used as a wiring material, the CVD-Cu film 111 is formed until the via hole 108 and the trench 109 are covered as shown in FIG. 5. Thus, a wiring and a plug are formed of the CVD-Ru film 111. When the CVD-Cu film is used as a Cu plating seed layer, the CVD-Cu film 111 is thinly formed on the surface of the CVD-Ru film 110 and the exposed surface of the Cu wiring layer 101, as shown in FIG. 6.

After the Cu film is formed in the above-described manner, the purge process is performed. In the purge process, the interior of the chamber 1 is purged by supplying a carrier gas as a purge gas into the chamber 1 while stopping the supply of Cu(hfac)TMVS and setting the vacuum pump of the gas exhaust unit 23 to a pull-end state. In this case, it is preferable to intermittently supply the carrier gas in order to rapidly purge the interior of the chamber 1.

Upon completion of the purge process, the gate valve G opens, and the wafer W is unloaded via the loading/unloading port 25 by a transfer device (not shown). Accordingly, a series of processes for a single wafer W is completed.

Figure 7:
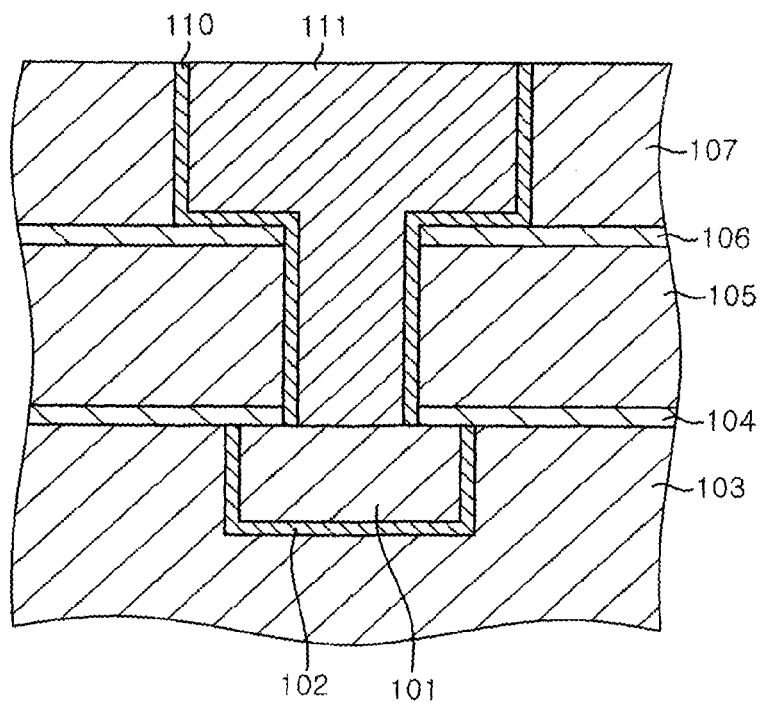
FIG. 7 is a cross sectional view showing a state in which CMP is performed on the semiconductor wafer having the structure presented in FIG. 5.
Figure 8:
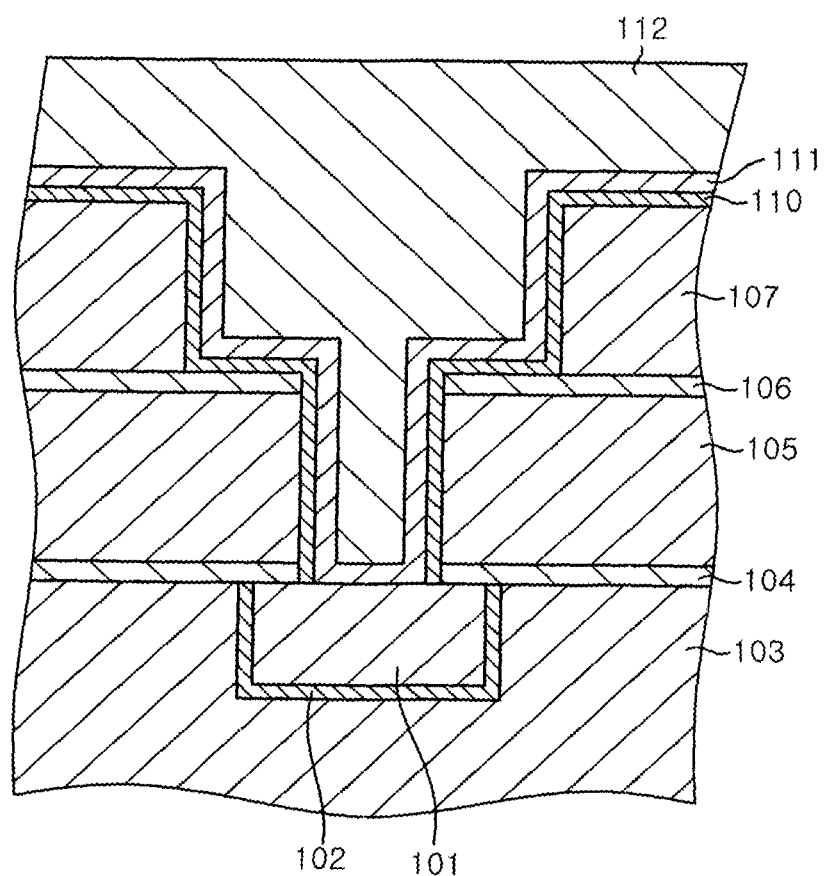
FIG. 8 is a cross sectional view showing a state in which Cu plating is performed on the semiconductor wafer having the structure of FIG. 6.
Figure 9:
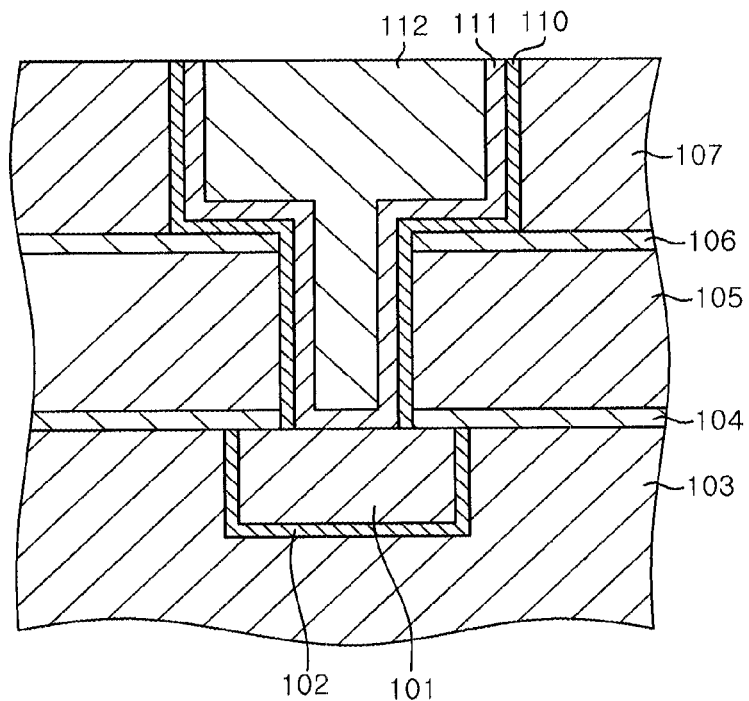
FIG. 9 is a cross sectional view showing a state in which CMP is performed on the semiconductor wafer having the structure illustrated in FIG. 8.

When the wiring and the plug are formed of the CVD-Cu film 111 as shown in FIG. 5, excessive Cu is removed by performing CMP (chemical mechanical polishing) such that the wiring insulating film 107 and the CVD-Cu film 111 are positioned on the same plane as shown in FIG. 7. When the CVD-Cu film 111 is thinly formed as a Cu plating seed layer as shown in FIG. 6, the wiring and the plug are formed of a Cu plating layer 112 as shown in FIG. 8. Then, excessive Cu is removed by performing CMP such that the wiring insulating film 107 and the Cu plating layer 112 are positioned on the same plane as shown in FIG. 9.

Figure 10:
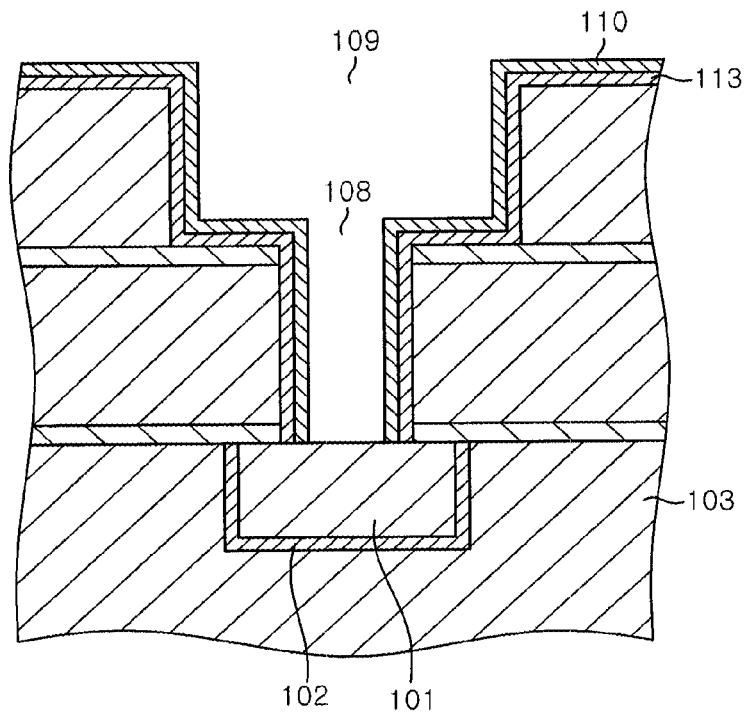
FIG. 10 is a cross sectional view showing another exemplary structure of the semiconductor wafer as the substrate to which the method for forming a Cu film in accordance with the embodiment of the present invention is applied.

In the above example, a single layer of the CVD-Ru film 110 is used as a barrier layer (diffusion prevention layer). However, as shown in FIG. 10, a laminated structure of a CVD-Ru film 110 as an upper layer and a high melting point material film 113 as a lower layer may be used. In this case, one of Ta, TaN, Ti, W, TiN, WN, manganese oxide and the like can be used for the lower layer.

In accordance with the present embodiment, the adsorption of the by-product on the Ru film formed on the substrate can be suppressed, so that it is possible to suppress the adsorption hindrance of the Cu source material and the decrease in the wettability between the Cu film and the Ru film. As a consequence, a smooth high-quality CVD-Cu film can be formed on the CVD-Ru film with high adhesivity.

Test Example

Hereinafter, a test example of the present invention will be described in comparison with a comparative example.

Here, a substrate was an Si substrate having thereon an SiO$_2$ film having a thickness of about 100 nm, and a barrier layer including a Ti film having a thickness of about 2 nm and a CVD-Ru film having a thickness of about 2 nm which was formed by sputtering. A Cu film was formed by the apparatus shown in FIG. 1 while using Cu(hfac)TMVS as a film-forming source material.

As for a film-forming source material, Cu(hfac)TMVS was supplied at a flow rate of about 250 mg/min. As for a carrier gas, H$_2$ gas was supplied at a flow rate of about 400 mL/min (sccm). A temperature of a susceptor was set to about 240° C. A pressure in the chamber 1 was set in different levels of about 4.0 Pa (0.03 Torr), about 6.65 Pa (0.05 Torr), about 13.3 Pa (0.1 Torr), about 20.0 Pa (0.15 Torr), about 40.0 Pa (0.3 Torr), about 66.5 Pa (0.5 Torr), and about 266 Pa (2 Torr).

Figure 11:
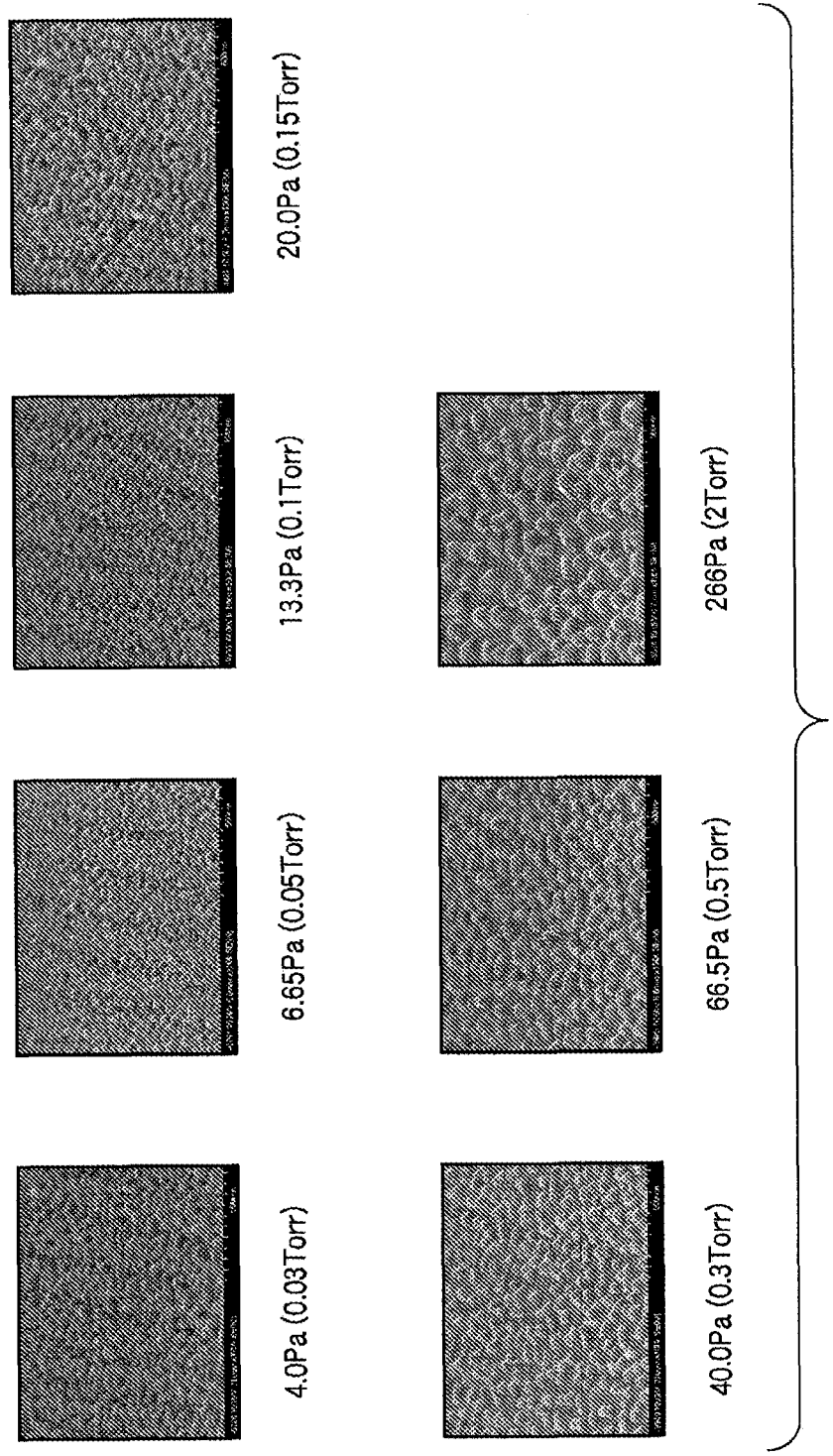
FIG. 11 provides scanning electron microscopic (SEM) images showing an initial nucleus state of Cu when a CVD-Cu film is formed by using Cu(hfac)TMVS as a film-forming material while varying a pressure in the chamber.

In that state, a Cu film was formed. The state of the initial nucleus of the Cu film formed at each pressure level is illustrated in a 100000 times magnified SEM image of FIG. 11. As shown in FIG. 11, when the pressure in the chamber 1 is lower than or equal to about 20.0 Pa (0.15 Torr), the initial nuclei of Cu are densely distributed and, thus, the nucleus density is high. When the pressure exceeds about 20.0 Pa (0.15 Torr), the initial nuclei of Cu are sparsely distributed and, thus, the nucleus density is decreased.

From the above, it is clear that the nucleus density of Cu obtained in the case of forming a Cu film can be increased by controlling the pressure in the chamber 1 to a level at which the desorption and diffusion of the by-product adsorbed on the surface of the base proceed.

Another Embodiment of the Present Invention

The present invention can be variously modified without being limited to the above embodiment. For example, although the case in which Cu(hfac)TMVS is used as a Cu complex having a vapor pressure higher than that of a by-product produced by thermal decomposition has been described in the above embodiment, it is not limited thereto. In addition, although the case in which a CVD-Ru film is used as a base film has been described, it is not limited thereto.

In the above embodiment, a Cu complex in a liquid state is force-fed to a vaporizer and then is vaporized therein. However, it may be vaporized in a different manner, e.g., bubbling or the like, other than the above-described manner.

Further, the film forming apparatus is not limited to that of the above embodiment, and there can be used various apparatuses such as an apparatus including a mechanism for forming a plasma to facilitate decomposition of a film-forming source material gas and the like.

The structure of the target substrate is not limited to those shown in FIGS. 2 and 10. Although the case in which a semiconductor wafer is used as a substrate to be processed has been described, another substrate such as a flat panel display (FPD) substrate or the like may also be used without being limited thereto.

While the invention has been shown and described with respect to the embodiments, it will be understood by those skilled in the art that various changes and modifications may be made without departing from the scope of the invention as defined in the following claims.

What is claimed is:

1. A method for forming a Cu film, comprising:
    loading a substrate in a processing chamber; wherein the substrate has on a surface thereof an Ru film formed by CVD using Ru3(CO)12 as a film-forming source material,
    introducing a film-forming source material in a vapor state into the processing chamber, the film-forming source material including a Cu complex having a vapor pressure higher than that of a by-product produced during film formation, wherein the Cu complex is copper hexafluoroacetylacetonate trimethylvinylsilane (Cu(hfac)TMVS), and the by-product is copper hexafluoroacetylacetonate (Cu(hfac)2);
    controlling a pressure in the processing chamber to a level at which desorption and diffusion of the by-product adsorbed on the substrate proceed; and
    forming a Cu film in the processing chamber, by decomposing the film-forming source material in the vapor state and depositing Cu on the substrate by CVD,
    wherein the Cu film is formed while maintaining the pressure in the processing chamber within a range of from 4 Pa (0.03 Torr) to 20 Pa (0.15 Torr).

2. The method of claim 1, wherein the Cu film is used as a wiring material.

3. The method of claim 1, wherein the Cu film is used as a Cu plating seed layer.

4. The method of claim 1, wherein the by-product is produced by a decomposition of the film-forming source material.

5. The method of claim 1, further comprising:
    introducing a carrier gas and a dilution gas into the processing chamber after said loading the substrate and before said introducing the film-forming source material.

6. The method of claim 5, wherein the pressure in the processing chamber is set to 1.33 to 266.6 Pa before said introducing the carrier gas and the dilution gas.

* * * * *